United States Patent
Dekker et al.

(10) Patent No.: US 8,383,060 B2
(45) Date of Patent: Feb. 26, 2013

(54) SYSTEM-IN-PACKAGE PLATFORM FOR ELECTRONIC-MICROFLUIDIC DEVICES

(75) Inventors: Ronald Dekker, Eindhoven (NL); Remco Henricus Wilhelmus Pijnenburg, Leuven (BE); Nicolaas Johannes Anthonius Van Veen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 972 days.

(21) Appl. No.: 12/293,284

(22) PCT Filed: Mar. 7, 2007

(86) PCT No.: PCT/IB2007/050759
§ 371 (c)(1),
(2), (4) Date: Sep. 17, 2008

(87) PCT Pub. No.: WO2007/107901
PCT Pub. Date: Sep. 27, 2007

(65) Prior Publication Data
US 2009/0072332 A1    Mar. 19, 2009

(30) Foreign Application Priority Data
Mar. 20, 2006  (EP) ................................. 06111392

(51) Int. Cl.
*G01N 15/06*  (2006.01)
*G01N 33/00*  (2006.01)
*G01N 33/48*  (2006.01)

(52) U.S. Cl. ......... 422/502; 422/50; 422/68.1; 422/81; 422/82; 422/82.01; 422/82.05; 422/503; 422/509; 436/43; 436/63; 436/149; 436/164

(58) Field of Classification Search ............. 422/50, 422/68.1, 81, 82, 82.01, 82.02, 82.05, 502, 422/503, 509; 436/43, 63, 149, 164
See application file for complete search history.

(56) References Cited

U.S. PATENT DOCUMENTS

| | | | |
|---|---|---|---|
| 5,585,069 A * | 12/1996 | Zanzucchi et al. | 422/505 |
| 6,048,734 A | 4/2000 | Burns et al. | |
| 6,057,149 A * | 5/2000 | Burns et al. | 435/287.2 |
| 6,493,090 B1 * | 12/2002 | Lading et al. | 356/484 |
| 6,632,400 B1 * | 10/2003 | Brennen et al. | 422/82.01 |
| 6,787,339 B1 * | 9/2004 | Rhine et al. | 435/173.7 |
| 2003/0104512 A1 | 6/2003 | Freeman et al. | |
| 2003/0160538 A1 * | 8/2003 | Tomonari et al. | 310/307 |
| 2005/0001182 A1 | 1/2005 | Wise et al. | |

FOREIGN PATENT DOCUMENTS

| | | |
|---|---|---|
| EP | 1250954 A2 | 10/2002 |
| WO | 9508716 A2 | 3/1995 |
| WO | 9519645 A1 | 7/1995 |
| WO | 9965664 A1 | 12/1999 |
| WO | 0170400 A1 | 9/2001 |

\* cited by examiner

*Primary Examiner* — Brian J Sines

(57) ABSTRACT

An integrated electronic-micro fluidic device an integrated electronic-micro fluidic device, comprising a semiconductor substrate on a first support, an electronic circuit on a first semiconductor-substrate side of the semiconductor substrate, and a signal interface structure to an external device. A micro fluidic structure is formed in the semiconductor substrate, and is configured to confine a fluid and to allow a flow of the fluid to and from the microfluidic structure only on a second semiconductor-substrate side that is opposite to the first semiconductor-substrate side and faces away from the first support.

16 Claims, 12 Drawing Sheets

D)

E)

F)

G)

H)

I)

SYSTEM-IN-PACKAGE PLATFORM FOR ELECTRONIC-MICROFLUIDIC DEVICES

Figure 1:
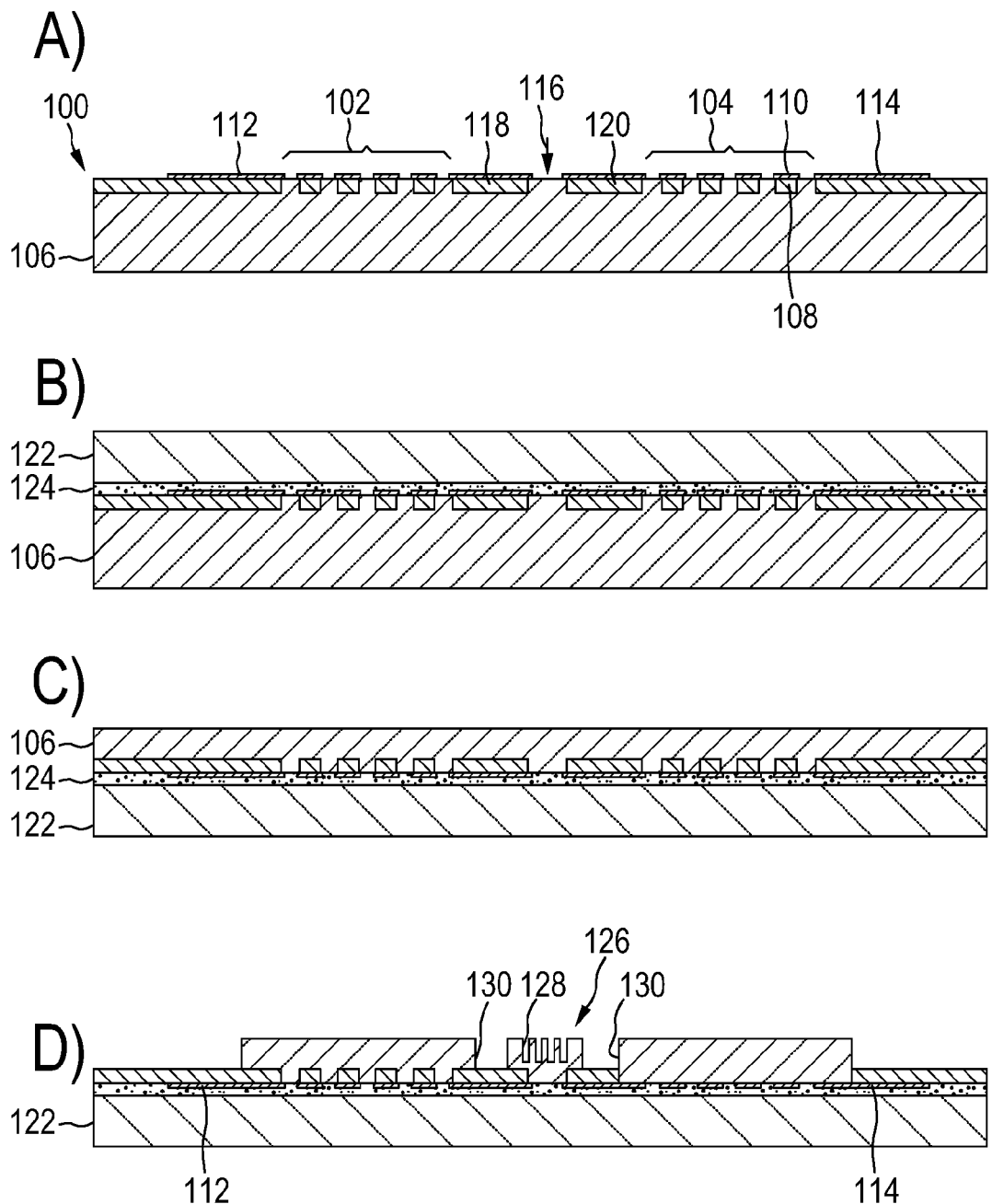
Figure 1:
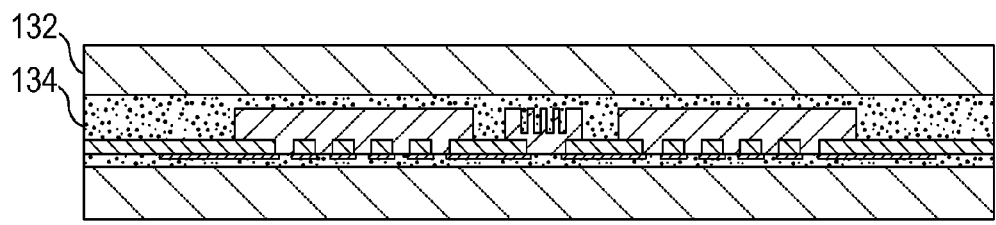
Figure 1:
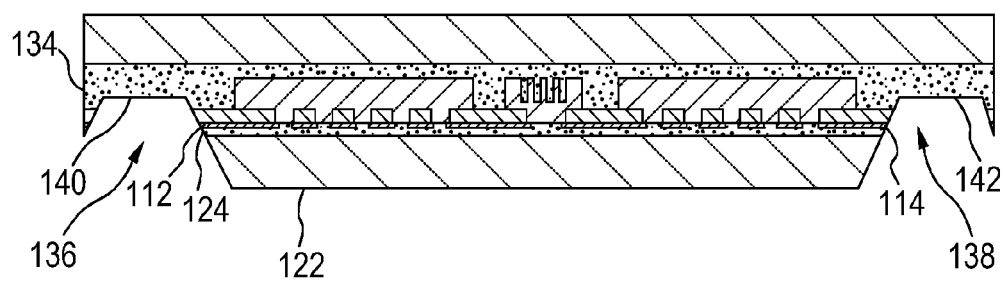
Figure 1:
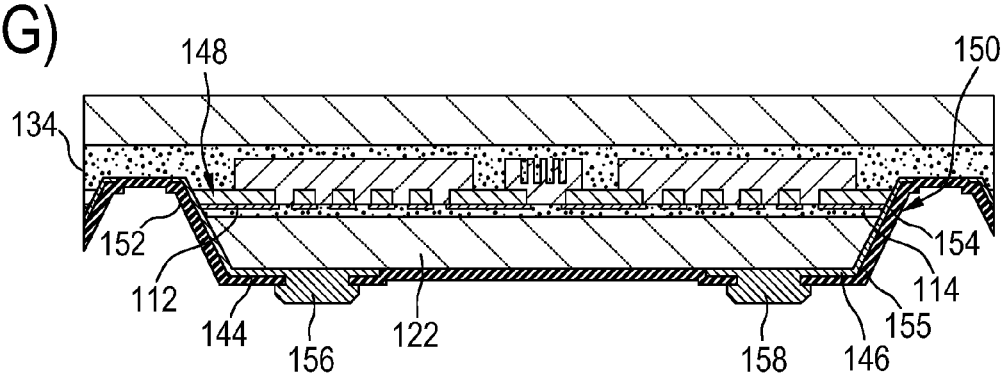
Figure 1:
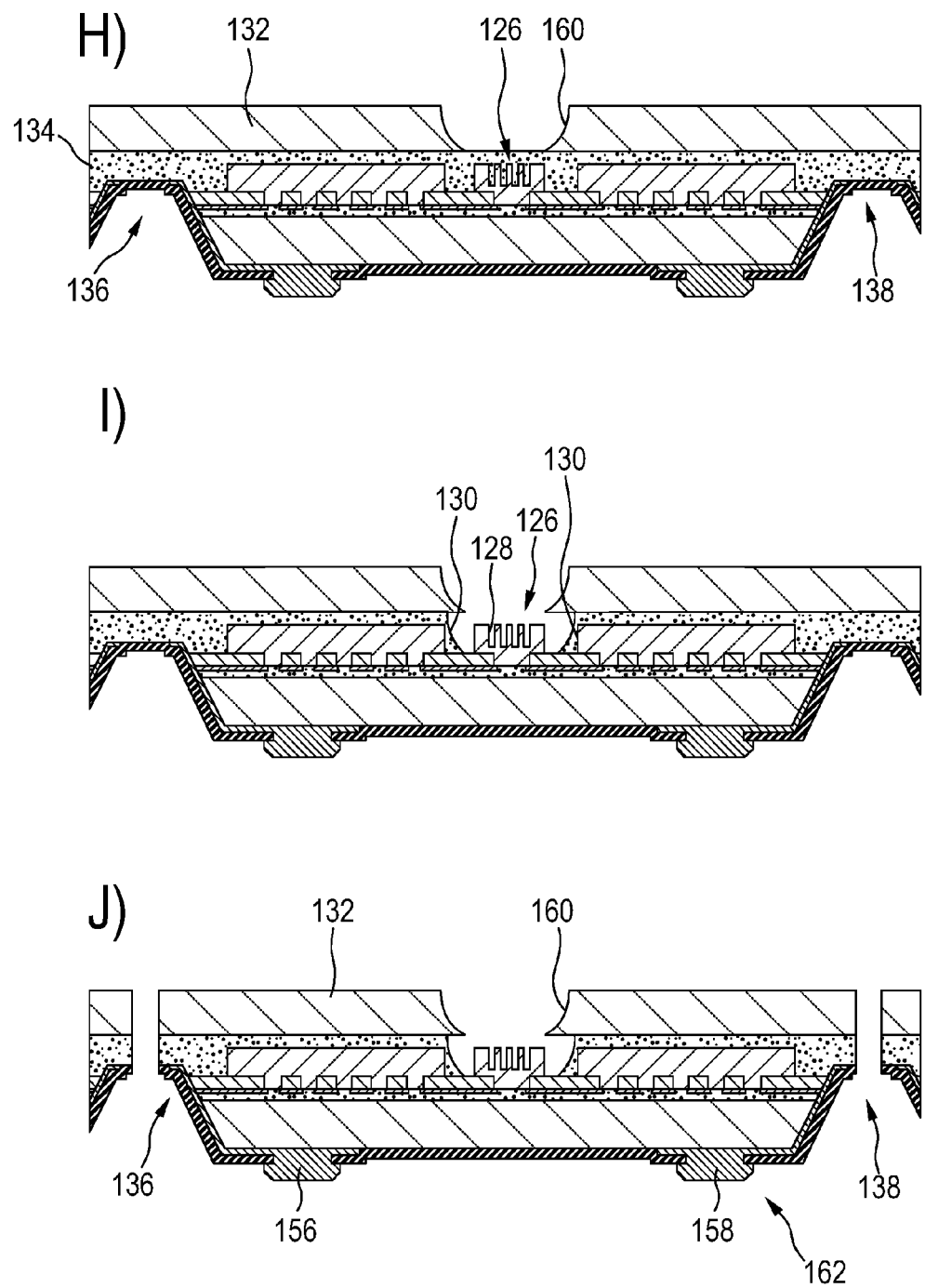

The present invention relates to an integrated electronic-microfluidic device. It also relates to an assembly comprising an integrated electronic-microfluidic device. The invention further relates to a method for fabricating an integrated electronic-microfluidic device and to a method for fabricating an assembly.

Microfluidic devices have been developed for performing chemical and biological analysis on a small scale. This has led to microfluidic Lab-On-Chip devices, which contain fluidic components and electrical driving circuits or sensor components integrated onto the same substrate. Such miniaturized devices thus form chemical reactors. They are capable of mixing reagents, thermal cycling, or other functions, including the detection of reaction products. Such a device is for instance known from U.S. Pat. No. 6,057,149.

A problem of such integrated electronic microfluidic devices is that wet-chemical interfaces and electrical interfaces are in close proximity. This bears a risk of exposing the electrical contacts to the chemicals, and, thus, a malfunctioning or destruction of the device.

It is therefore an object of the present invention to provide an integrated electronic-microfluidic device and an assembly containing such an integrated electronic-microfluidic device, which provide a better isolation between chemical interfaces and electrical interfaces.

It is a further object of the present invention to provide a method for fabricating an integrated electronic-microfluidic device and for fabricating an assembly containing such an integrated electronic-microfluidic device, which enable a better isolation of chemical and electrical interfaces.

According to a first aspect of the invention an integrated electronic-microfluidic device is provided, comprising
  a semiconductor substrate on a first support;
  an electronic circuit on the semiconductor substrate;
  a signal interface structure, which is arranged on a first semiconductor substrate side facing the first support and which is connected with the electronic circuit and configured to exchange incoming and outgoing signals with the electronic circuit and with an external communication channel;
  a microfluidic structure in the semiconductor substrate, which is configured to confine the fluid and to allow a flow of a fluid to and from the microfluidic structure only on a second semiconductor-substrate side that is opposite to the first semiconductor-substrate side and faces away form the first support.

In the integrated electronic-microfluidic device of the invention, the functional electronic and microfluidic device sections are concentrated in the semiconductor substrate. On one hand, the semiconductor substrate contains one or more electronic circuits and a signal interface structure to one or more external devices. The electronic circuit forms a network of circuit elements such as transistors, diodes, resistors, capacitors, inductors, etc., to serve a specific function like, for example, driving a heater structure in the semiconductor substrate, or converting analog sensor signals into digital signals, etc. The signal interface structure forms an interface between the electronic circuit on the semiconductor substrate and the external device. Electrical signals, such as an electrical current or a voltage, are communicated between the electronic circuit and the signal interface structure. As such, the signal interface structure receives the electrical signals from the electronic circuit. Communication with an external device may use electrical signals as well, or other types of signals, such as an electromagnetic signals, e.g., at radio frequency or optical frequency. Optionally, of course, the interface structure may also be configured to allow communication originating at an external device and directed towards the electronic circuit. However, in sensor applications for instance it will often suffice to communicate signals "one-way" to the external device.

On the other hand, the semiconductor substrate further contains a microfluidic structure. Microfluidic structures as such are well known in the art, as described earlier, and may serve many different purposes, such as detecting molecules in a fluid, heating a fluid, accommodating chemical reactions of one or more fluids, or simply store or transport a fluid. The microfluidic structure is formed in the semiconductor substrate and confines a fluid. That is, the microfluidic structure provides a volume for accommodating, holding or transporting a fluid (a gas or a liquid). The fluid confinement may thus serve to guide the fluid or limit propagation of the fluid in certain directions and beyond certain points. Typically, the microfluidic structure has walls, which are impermeable for the fluid, in order to confine the fluid within a desired volume in the semiconductor substrate.

Confinement of the fluid can be provided in several directions, parallel or perpendicular to the main surface of the semiconductor substrate, of course, as desired in a particular application. However, according to the invention, at least one microfluidic structure is configured to allow a flow of the fluid to and from the microfluidic structure only on a second semiconductor-substrate side that is opposite to the first semiconductor-substrate side and faces away from the first support.

The electronic circuit and the signal interface structure on one hand and the microfluidic structure on the other hand are provided on opposite sides of the semiconductor substrate. Therefore, fluidic, in particular, wet interfaces and electrical interfaces to the semiconductor substrate are provided on opposite sides of the semiconductor substrate. The integrated electronic-microfluidic device of the invention thus secures a clear separation between electrical and microfluidic parts of the device. This structural feature thus reflects the general concept of the present invention, namely a strict local separation of the chemical and electrical interfaces to external devices.

It is noted however, that the device can, of course, additionally include desired combined electro-chemical interfaces. For instance, provisions can be made for a direct galvanic contact between a fluid and an electrical contact element in a microfluidic structure that forms a reaction chamber in the semiconductor substrate.

The function of the first support is to support the semiconductor substrate. It must thus be rigid enough to provide support and durable enough to withstand the processing conditions during manufacture and operating conditions (for instance exposure to chemicals, high temperatures, or radiation) it is subjected to. As such, it can be made of a variety of materials, such as glass, plastic, epoxy resin, etc., and in various shapes, such as a plate, a cube or a beam, depending on a respective microfluidic application. Furthermore, the "electrical side" of the semiconductor substrate faces towards the first support, which also has the advantage of protecting the circuit and the signal interface structure from fluidic access.

The electronic-microfluidic device of the invention forms a System-in-Package (SiP) platform that can be used as a basis for many specialized device applications. SiP devices are functional systems that are made up of sub-systems, which are combined in a package format of industry-standard integrated circuit packages.

Many structures for microfluidic devices are known in the art, and some will be described in more detail in the context of preferred embodiments. The electronic-microfluidic device of the invention also forms a module that is easily integrated into an assembly on a circuit board, as will also be described in more detail later.

In the following, preferred embodiments of the electronic-microfluidic device of the first aspect of the invention will be described. The embodiments can be combined, unless it is explicitly stated or obvious from the respective context that they can only form alternatives.

The electronic-microfluidic device of the invention is preferably based on a substrate transfer technology (STT), which allows the formation of microfluidic structures even in a thinned semiconductor substrate without creating a risk of making the device fragile during processing and later handling. An overview of STT is given in the Ronald Dekker, Substrate transfer technology, Delft University of Technology, 2004, which is incorporated herein by reference in its entirety.

A preferred material of the semiconductor substrate is silicon. Advantages of this material choice will be explained further below in the context of further preferred embodiments.

A preferred embodiment of the electronic-microfluidic device further comprises a second support on the second semiconductor-substrate side. The second support has an opening that allows a flow of the fluid to and from the microfluidic structure. The second support further stabilizes the device and seals portions of the second semiconductor-substrate side that shall not be exposed to the environment or to a fluid.

According to a further preferred embodiment, the signal interface structure comprises at least one T-shaped internal-contact element. This internal-contact element has two sections that correspond to the horizontal and vertical bars of the letter "T". The section corresponding to the vertical T-bar is also referred to as the substrate section. It is arranged on the semiconductor substrate and connects to the electronic circuit. Another section of the internal-contact element, which corresponds to the horizontal T-bar is provided on an inclined side face of the substrate stack. This section is also referred to as the side-face section, because it forms an electrically isolated lead that connects to the external-contact elements. Therefore, the substrate section and the side-face section of the internal-contact element connect the electronic circuit on the semiconductor substrate with the external-contact elements. Both sections of the internal-contact element are sealed from fluid access. The substrate section is sealed due to the sandwich structure of the substrate stack, which is formed by the first support, the semiconductor substrate, and the second support. The electrical isolation of the side-face section seals the internal-contact element on the inclined side face.

The device structure of this embodiment is compatible with the well-known ShellCase packaging concept known from WO 95/19645, which is incorporated herein by reference in its entirety. The present embodiment extends the applicability of this packaging concept to electronic-microfluidic devices.

A support preferably takes the form of a support plate. If an electrically conductive support is to be used, care has to be taken to provide an electrical insulation between the support plate and the semiconductor substrate in order to avoid undesired short cuts between electronic circuits provided on the semiconductor substrate. Also, the support plate should be isolated from any electrical contact elements provided on the electronic-microfluidic device in order to avoid short cuts between different contact structures, where required for proper function of the device.

In a further improvement of the embodiment that uses a T-shaped internal contact element, the second section of the T-shaped internal-contact element is arranged abutting the semiconductor substrate. The semiconductor substrate comprises a first electrical-isolation trench that is arranged and configured to isolate the second section of the T-shaped internal-contact element on one side from semiconductor substrate portions on the opposite side of the first electrical-isolation trench. The isolation trench preferably extends through the semiconductor substrate, down to an oxide layer that has previously been formed on the substrate and that laterally extends beyond the isolation trench.

This embodiment avoids an electrical short cut between the side-face section on the inclined surface on the stacked substrate and the semiconductor substrate. In an alternative embodiment, the lateral extension of the substrate is reduced to provide an electrically isolating filling between the semiconductor substrate and side-face section of the internal-contact element. The filling material is preferably an adhesive that is used for mounting the semiconductor substrate on the second support plate.

In one preferred embodiment, either only the first support or the first and second supports are thermally insulating. The microfluidic structure is surrounded by a first thermal-isolation trench in the semiconductor substrate. The thermal-isolation trench is open to the second semiconductor substrate side and is filled with a thermally insulating material or is at least partially empty.

The present embodiment makes use of the advantageous properties of the electronic-microfluidic device to integrate a thermally isolated microfluidic structure. A thermal isolation of a microfluidic structure is useful for instance when heating this structure to a certain temperature. Heating can be required for instance to promote or sustain a chemical reaction. An example of such a chemical reaction is a polymerase chain reaction (PCR) for multiplying a DNA (desoxy ribonucleic acid). Another use of a thermally isolated region is the sensitive detection of temperature changes due to a chemical reaction, e.g., with a micro-calorimetric sensor.

The heating means or detection means, respectively, are arranged on the first semiconductor-substrate side, advantageously within the thermally isolated region. Electrical coupling of the heating means or detection means to other parts of the electronic circuit outside the thermally isolated region will not disturb the thermal isolation much.

The present embodiment is particularly advantageous for integrated electronic-microfluidic devices that contain a silicon semiconductor substrate. Silicon is considered to be a very suitable material for the fabrication of integrated electronic-microfluidic devices such as Lab-on-chip or sensor devices. However, its high thermal conductivity makes it difficult to fabricate thermally isolated regions in the device. In the prior art, one commonly used method to overcome the problem has been to locally thin the silicon substrate, resulting in a membrane. Membrane processing, however, is not suitable for mass-production. Membranes are fragile and break easily during subsequent processing, which results in a loss of yield of the fabrication process. Furthermore, membrane processing it is almost always based on an etching of a silicon wafer from the backside using tetra-methyl ammonium hydroxide (TMAH) or potassium hydroxide (KOH). This requires a protection of the front side of the wafer due to the aggressive nature of the etchants, which is difficult. Furthermore, KOH etching is not well understood and can sometimes result in an unexpected etch behavior. A further disadvantage of using a KOH etchant is that it requires special wet benches, which are not part of the standard equipment found in most semiconductor fabs.

In contrast, the present embodiment makes use of the arrangement of the semiconductor substrate on a first thermally insulating support. Suitable thermal insulators are for instance electrical insulators. Electrical insulators are generally good thermal insulators as well. Materials that form an exception to this rule, for instance diamond and BeO, should not be used as the material of the supports for the present embodiment.

In this embodiment, the use of substrate transfer technologies proves particularly advantageous. STT has been considered disadvantageous in the art for many applications. This was due to the high thermal resistance that is implied by a choice of the support material, which, typically for STT, is an electrically insulating material such as glass, ceramics, or a polymer. In the present embodiment, however, as a result, the stacked substrate of the invention is highly suitable for the purpose of thermal isolation, and thermally isolated regions can easily be formed in the semiconductor substrate by forming one or more thermal-isolation trenches around them.

Preferably, the first thermal-isolation trench extends from the second semiconductor-substrate side through the semiconductor substrate and is covered on the first substrate side by a thermally insulating layer, for instance a silicon dioxide layer, which is arranged on the semiconductor substrate. This way, the presence of thermally conductive substrate material (silicon) is minimized The thermal isolation trench can be filled with a thermally insulating material. Another alternative to obtain good thermal isolation is to keep the thermal-isolation trench at least partly empty. A partial filling of the thermal-isolation trench preferably uses a material with a high thermal resistance. Many adhesives that are used for mounting the semiconductor substrate on the first support plate are suitable in this context.

The use of electrically and/or thermally insulating supports is generally preferred also for other applications of the electronic-microfluidic device of the invention, independent from the further specific structural features of the present embodiment.

In the following, several examples of advantageous implementations of microfluidic structures in the device of the invention will be described.

The microfluidic structures of the following examples are preferably implemented in a thinned semiconductor substrate, such as a thinned silicon substrate.

A first example is a reaction chamber that is formed by a first recess in the semiconductor substrate. The reaction chamber is confined by a recess wall. Preferably, for thermal isolation of the reaction chamber, a second thermal-isolation trench is arranged surrounding the recess wall.

This way, heat that is produced in the reaction chamber by chemical reactions is confined to the lateral substrate region of the reaction chamber. The thermal-isolation trench can also be used for a circulation of a cooling fluid.

The reaction chamber can in a further development be arranged opposite to a heater array that forms a part of the electronic circuit and is arranged on the first semiconductor-substrate side. This way, chemical reactions can be performed in a controlled manner.

In a second example the microfluidic structure comprises an electrophoretic pump. For this, a second recess is arranged in the semiconductor substrate, and two field plates, which are formed by walls of the recess, which are electrically isolated from the semiconductor substrate by an adjacent second electrical-isolation trench.

A third example is formed by an electronic-microfluidic device, in which the electronic circuit comprises a photodiode that is arranged immediately adjacent to a microfluidic structure in the form of a microfluidic channel in the semiconductor substrate. The generation of light during a chemical reaction can thus be detected on-chip.

In a fourth example the electronic circuit comprises two contact elements on the first semiconductor substrate side that extend to a microfluidic structure in the form of a third recess in the semiconductor substrate. The contact elements are configured to establish a direct galvanic contact to a fluid in the third recess during operation of the device.

In a further preferred embodiment, a layer of Benzocyclobutene, BCB, is arranged between the second support plate and the semiconductor substrate.

The use of BCB represents an advantageous embodiment over the use of anodic bonding, which has strict requirements with regard to flatness and cleanness of the surfaces. In addition, anodic bonding requires high temperatures. That restricts the choice for an adhesive, which is used to glue the semiconductor substrate to the first support plate, to materials that can withstand such high temperatures. BCB, in contrast, is ideally suitable for planarizing and for adhesive bonding over cavities in the semiconductor substrate. Therefore, a permanent attachment between the semiconductor substrate and the second support plate can be achieved, and an unintentional filling of the microfluidic structures comprised by the semiconductor substrate is avoided. Further details of the use of BCB will be explained in the context of a preferred embodiment of the method of the invention.

In a further preferred embodiment, the opening in the second support plate is configured to hold a removable lid. Consequently, a further embodiment of the integrated electronic-microfluidic device comprises a removable lid arranged in the opening of the second support plate. The removable lid may comprise at least one opening that is configured to allow an input or output of a fluid to the microfluidic structure provided on the semiconductor substrate. However, such openings may also be placed in the second support plate, which allows leaving the removable lid without any opening. In this case, the removable lid only serves to provide an opening for cleaning the microfluidic structure. A removable lid can be produced by a cheap mounding or casting technique. It can easily be replaced when the device is to be used for a different chemical reaction. Also, the removable lid allows an easy large-area access to the microfluidic structure in the semiconductors for the purpose of cleaning the microfluidic structure.

The first and second supports are preferably glass plates. Glass is a well-known material for integrated electronic-microfluidic devices. In the present context its advantage is in a high thermal resistance.

However, alternative materials can also be used advantageously for the supports. Certain polymers, in particular, polyimides provide rigidity to support the semiconductor substrate and prevent breakage. On the other hand, known polyimides offer superior heat resistance and chemical resistance, which makes them particularly suitable for lab-on-chip applications. In alternative embodiments, either the first, or the second, or both supports are formed by a polyimide. For instance, when contact of the second support with chemicals is expected, which can damage other support materials such as glass, a polyimide can be used. On the other hand, if the device generates or is exposed to large high temperatures, it may be advantageous to provide a polyimide first support as well. Beside polyimides, an epoxy resin or certain polycarbonates may provide useful properties that makes same suitable materials for the first or second support.

According to a second aspect of the invention, an assembly is provided that comprises an integrated electronic-microfluidic device according to the first aspect of the invention or one of its embodiments. The electronic-microfluidic device is mounted on a circuit board. The external-contact elements of the integrated electronic-microfluidic device are connected to contact structures provided on the circuit board.

In addition to providing a clear separation between electrical and chemical interfaces, the assembly of the present aspect of the invention has the advantage of a large flexibility in the combination of different electronic-microfluidic devices and circuit boards. Depending on a desired application, a specific electronic-microfluidic device can be selected and mounted on a circuit board that preferably has a standard electrical interface for connection with the electronic-microfluidic device.

In a preferred embodiment of the assembly, an electrically isolating underfilling layer is arranged in a spacing between the circuit board and the electronic-microfluidic device. The underfilling is configured to prevent a penetration of a fluid into the spacing.

This way, the sealing of the external electrical interface of the electronic-microfluidic device is maintained also in an assembly on a printed circuit board. The clear separation between a "wet side" and an "electrical side" is further improved.

In a further development of this concept, contact structures are arranged on one side of the circuit board facing the electronic-microfluidic device and electrically connected to electronic circuits that are provided on an opposite side of the circuit board. Bond pads to external devices are also preferably provided on that opposite side of the circuit board. The electrical connection between the two opposite sides of the circuit board is preferably accomplished by through-board vias.

According to a third aspect of the invention, a method is provided for fabricating an integrated electronic-microfluidic device with an electronic circuit and a microfluidic structure. The method comprises the following steps:
  fabricating a semiconductor wafer that comprises, for later separation into a multitude of individual electronic-microfluidic devices, a multitude of electronic circuits and signal interface structures on a first wafer side;
  mounting the semiconductor wafer onto a first support with the first wafer side facing the first support;
  thinning the semiconductor wafer from a second wafer side that is opposite to the first wafer side;
  forming a multitude of microfluidic structures in the semiconductor wafer from the second wafer side; and
  dicing the wafer.

The method of the second aspect of the invention allows economically fabricating the integrated electronic-microfluidic device of the first aspect of the invention. The advantages of the method of the invention correspond to those mentioned earlier in the context of the description of the electronic-microfluidic device of the first aspect of the invention. In addition, the method of the invention provides an efficient way for producing a large number of electronic-microfluidic devices from a semiconductor wafer that has been processed according to the method of the invention.

A multitude of different devices for different electronic and microfluidic applications can be fabricated using the method of the second aspect of the invention. This provides an economic advantage, because only mask processes need to be changed to fabricate the particular electronic devices and microfluidic structures. The general processing scheme remains identical for all sorts of electronic-microfluidic devices.

In the following, preferred embodiments of the method of the invention will be described. The embodiments can be combined, unless it is explicitly stated or obvious from the respective context that embodiments form alternatives.

In a preferred embodiment, the step of forming a multitude of microfluidic structures comprises forming a first thermal-isolation trench in the semiconductor wafer around at least one of the microfluidic structures. As mentioned before in the context of the description of the corresponding embodiment of the electronic-microfluidic device of the first aspect of the invention, this embodiment provides a simple process for forming thermally isolated microfluidic structures.

In a further preferred embodiment, the step of sealing the microfluidic structures by mounting a second support plate comprises the steps of
  depositing a layer of Benzocyclobutene, BCB, on the second support plate
  mounting the second support plate on the second wafer side, thus forming a stacked substrate
  curing the BCB layer by first heating the stacked substrate to a temperature between 170° C. and less than 200° C., and subsequently heating the stacked substrate to a temperature of 200° C.

This embodiment makes use of the advantageous properties of BCB. This material has a unique temperature characteristic. BCB becomes liquid with a viscosity similar to that of water, when a temperature of 170° C. is reached. Upon further heating to 200° C., BCB solidifies again and finally cross-links at 200° C. Therefore, BCB is suitable for planarizing and also for adhesive bonding over cavities. Preferably, before the step of curing the BCB layer, a step of baking the BCB layer at a temperature below 170° C., until it is completely dry.

A preferred embodiment of the method further comprises the steps of
  forming, for each electronic-microfluidic device on the wafer, a substrate section of a T-shaped internal-contact element, the substrate section corresponding to the vertical T-bar and being connected to the electronic circuit of the respective electronic-microfluidic device,
  forming notches in the first support and the semiconductor wafer, thus defining inclined side faces for each electronic-microfluidic device;
  forming leads on the inclined side faces, thus completing a side-face section (152, 154) of the of the T-shaped internal-contact element corresponding to the horizontal T-bar;
  forming external-contact elements for electrical contact to an external device.

The present embodiment combines the advantages of substrate transfer technology and of the ShellCase method of WO 95/19645 for producing integrated circuit devices to a new SiP platform technology in the field of electronic-microfluidic devices.

In a further preferred embodiment, the step of forming leads on the inclined side faces comprises forming the second section of the T-shaped internal-contact element abutting the semiconductor substrate, and wherein a step of forming a first electrical-isolation trench for isolating the second section of the T-shaped internal-contact element from semiconductor substrate portions is performed together with the step of forming a multitude of microfluidic structures. This processing allows to form sections of the leads directly on the side face of the semiconductor substrate and at the same time avoids a risk of a short cut between the internal-contact element and the substrate.

In a further embodiment, the step of mounting the semiconductor wafer on a first support comprises
forming a polymer layer on the wafer;
forming a lift-off layer on the polymer layer; and
mounting a temporary support on the lift-off layer.

In this embodiment, the temporary support is lift off during later processing by removing the lift off layer. This way, the polymer layer forms the first support during operation of the electronic-microfluidic device. The temporary support layer provides additional stability during the fabrication of the device. The lift-off layer can for instance be an oxide layer that is easily removed.

In a further embodiment of the method of the invention, the step of providing at least one opening in the second support plate for each electronic-microfluidic device comprises configuring an opening in the second support plate to hold a removable lid. This embodiment allows an easy reuse of the electronic-microfluidic device for different chemicals, by providing a large area access to the microfluidic structure in the opening for the lid that can be used in a cleaning process.

According to a fourth aspect of the invention a method for fabricating an assembly according to the second aspect of the invention comprises a step of fabricating an integrated electronic-microfluidic device according to the method of the third aspect of the invention or one of its embodiments, and a step of mounting the electronic-microfluidic device on a circuit board.

The advantages of the method of the fourth aspect of the invention result directly from the advantages of the method of the third aspect of the invention.

In the following, further embodiments of the invention will be explained with reference to the enclosed Figures.

FIGS. 1A)-J) show different stages of a fabricating process for an integrated electronic-microfluidic device that contains a micro-calorimetric sensor.

Figure 2:
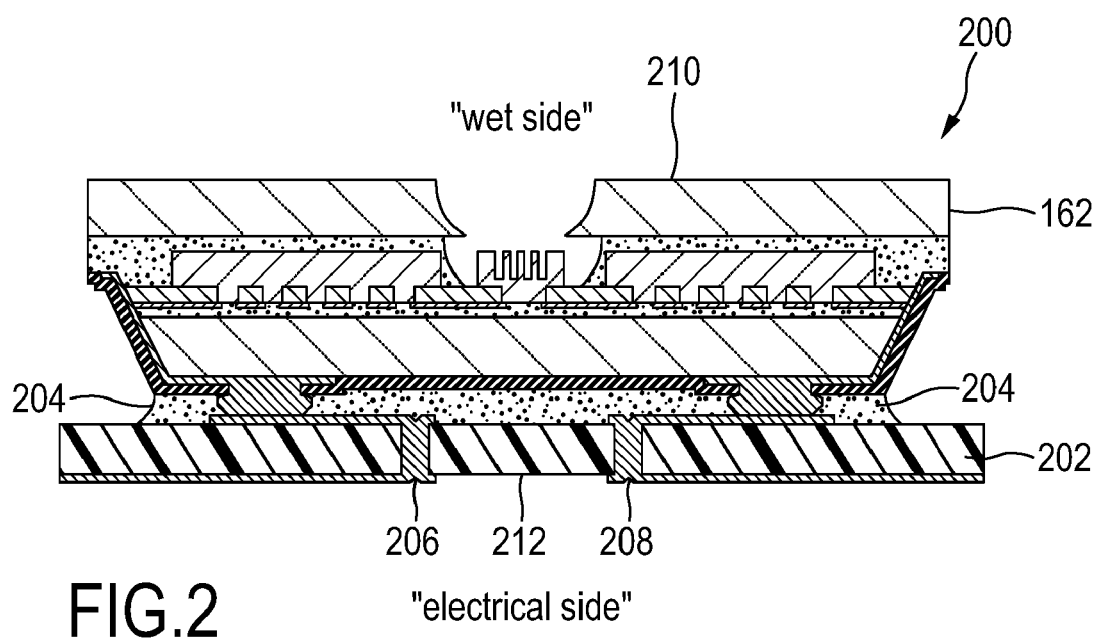

FIG. 2 shows an example of an assembly that contains the electronic-microfluidic device fabricated according to the process of claim 1.

FIGS. 3A)-I) show different stages during the fabrication of a Lab-on-chip device.

Figure 4:
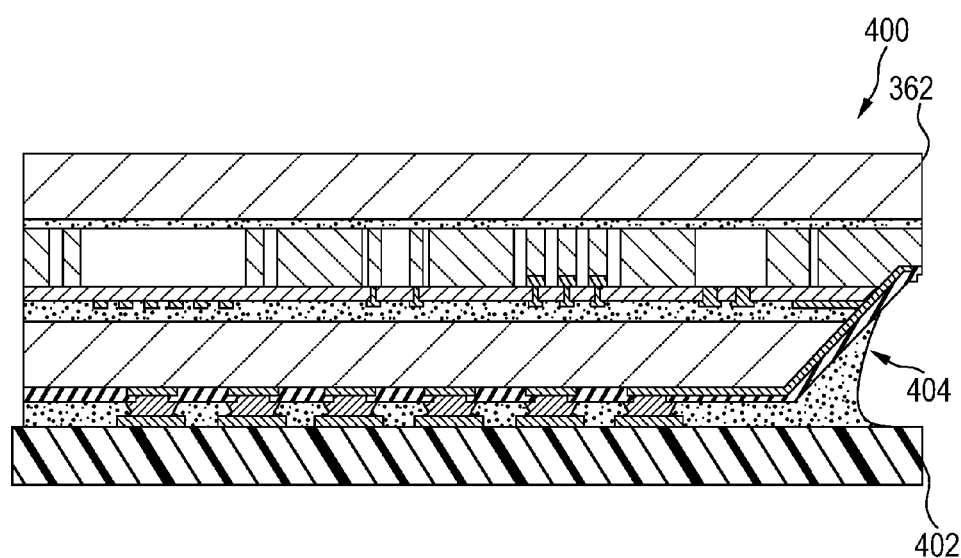

FIG. 4 shows a Lab-on-chip device integrated in an assembly on a printed circuit board.

Figure 3:
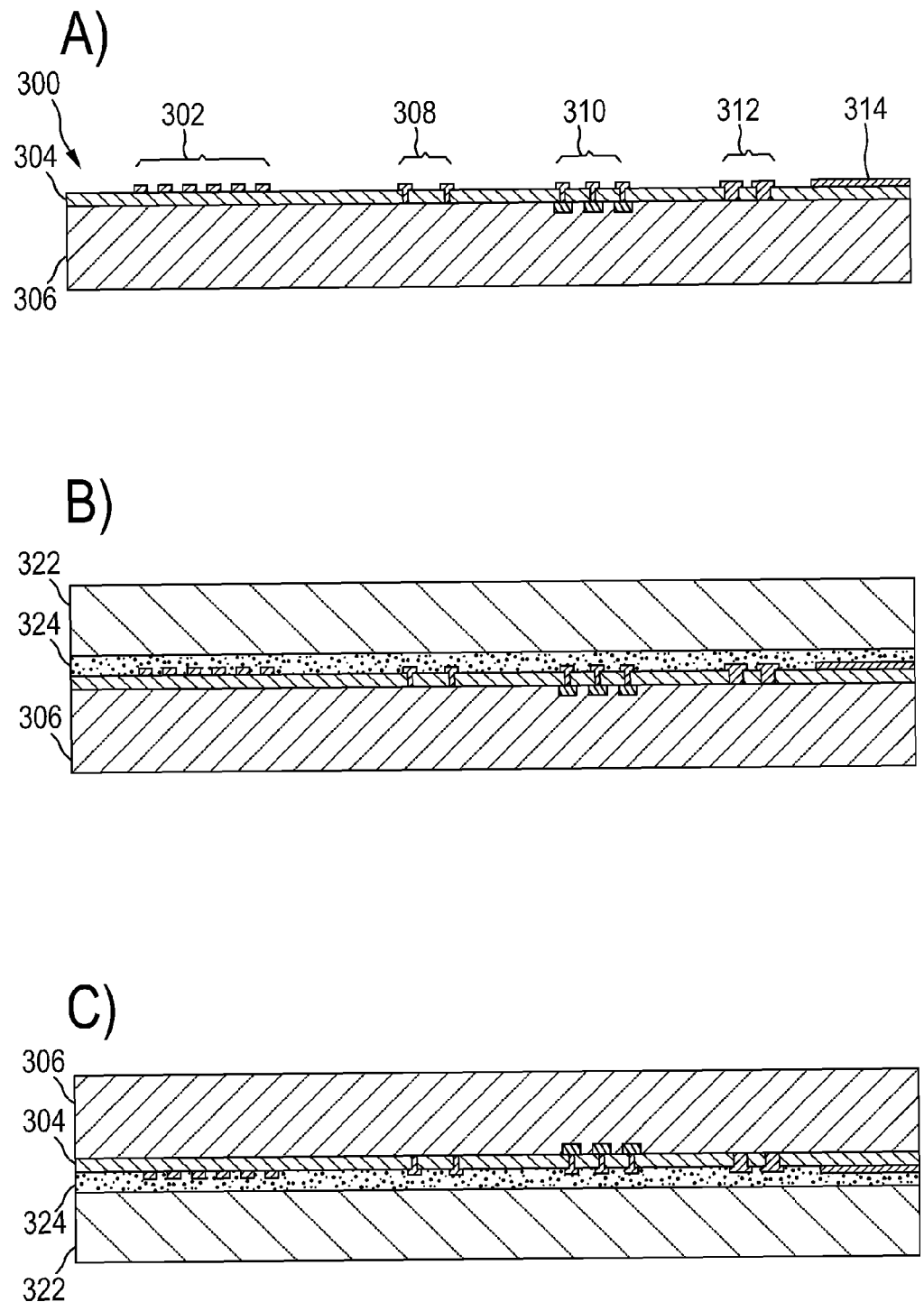
Figure 3:
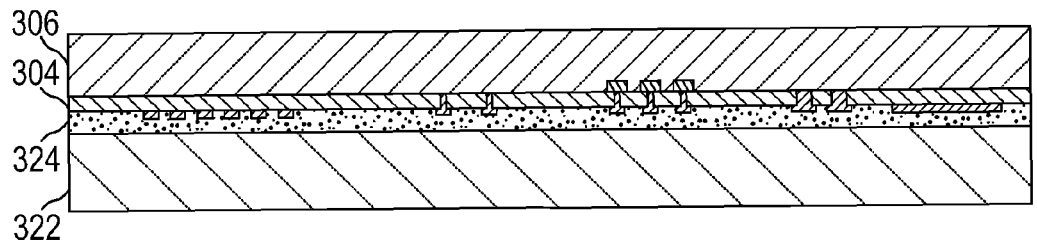
Figure 3:
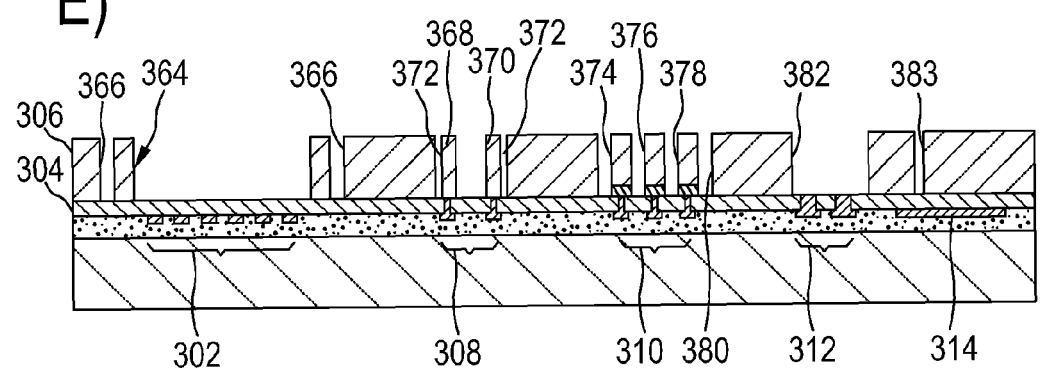
Figure 3:
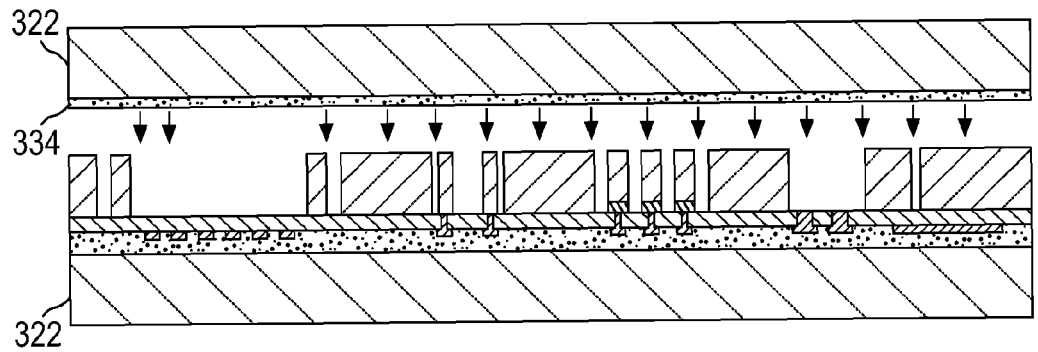
Figure 3:
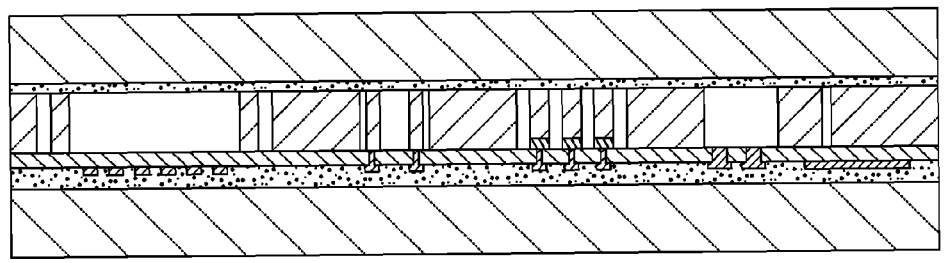
Figure 3:
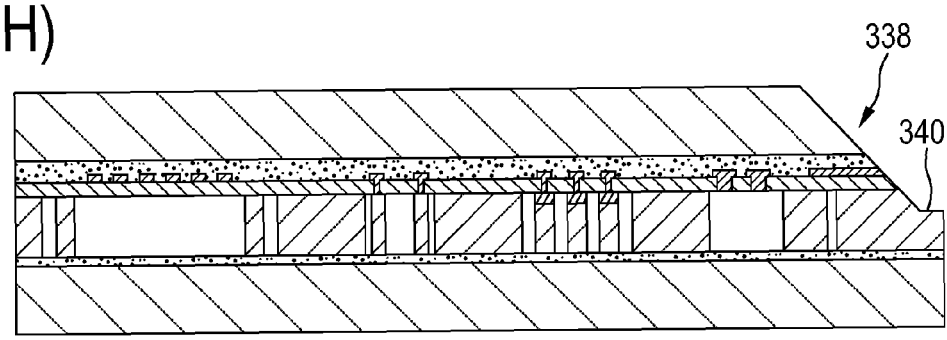
Figure 3:
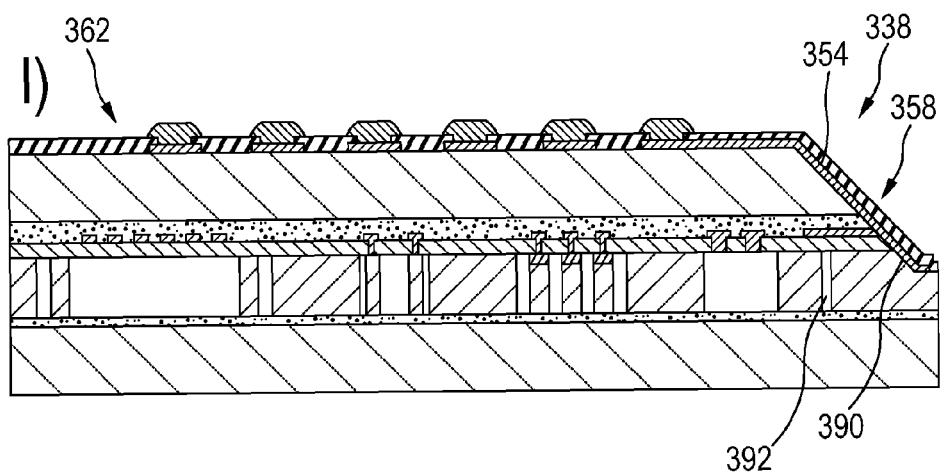

FIGS. 5A)-D) show different stages during the fabrication of a variant of the Lab-on-chip device of FIGS. 3 and 4.

Figure 5:
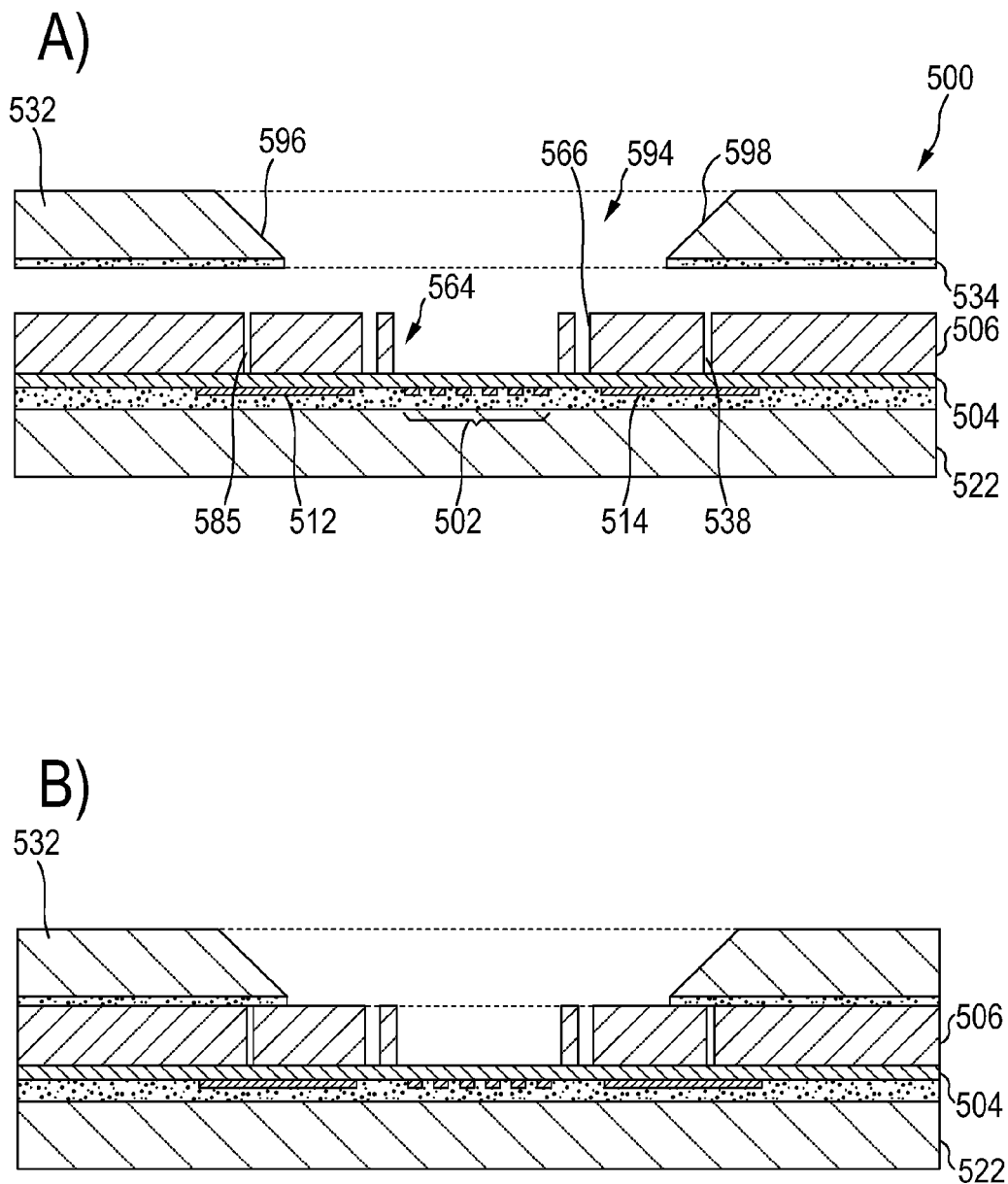
Figure 5:
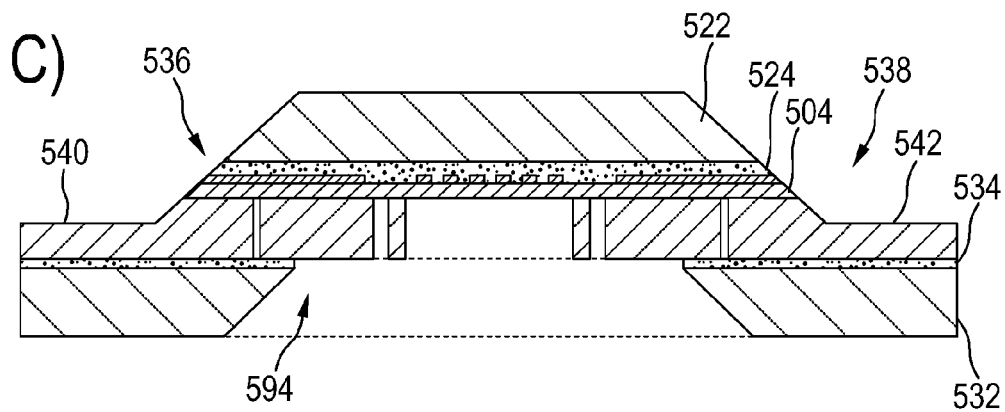
Figure 5:
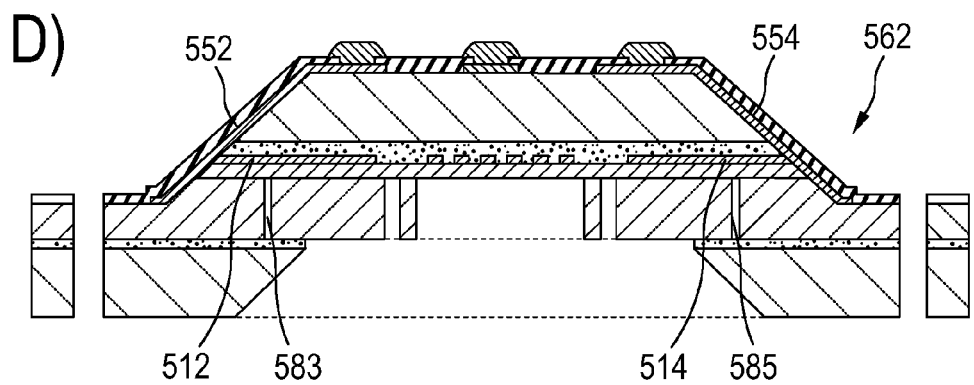
Figure 6:
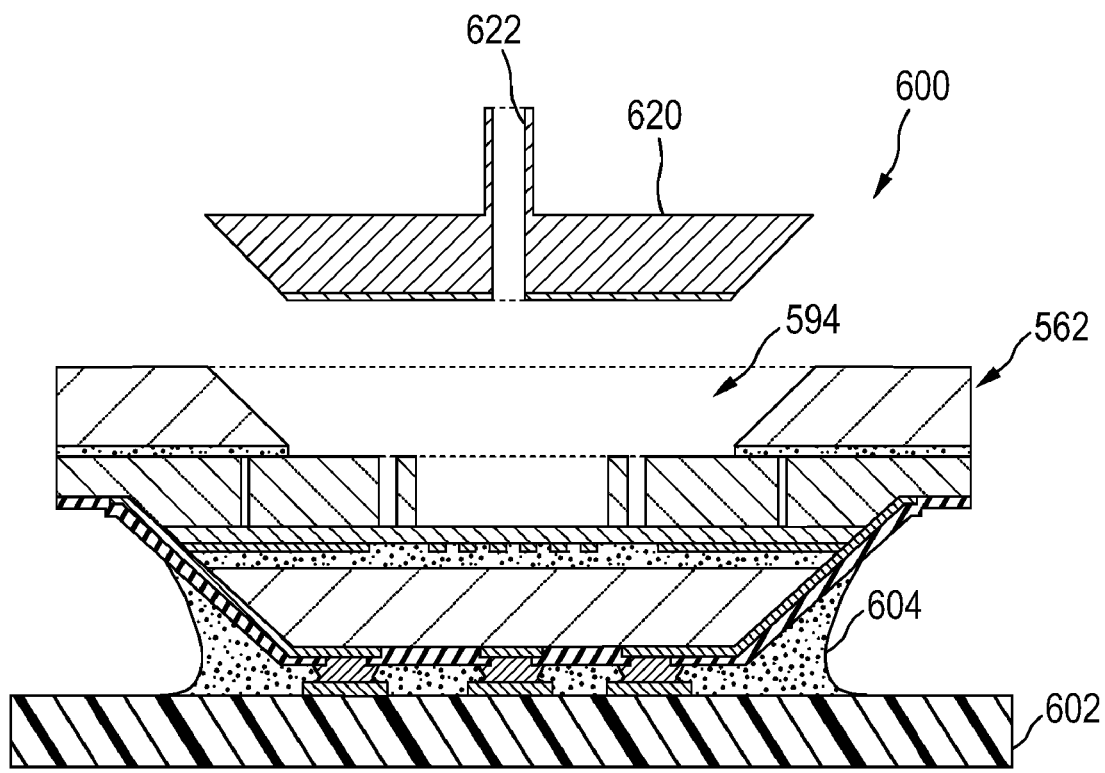

FIG. 6 shows the Lab-on-chip device fabricated according to the method of FIG. 5.

Figure 7:
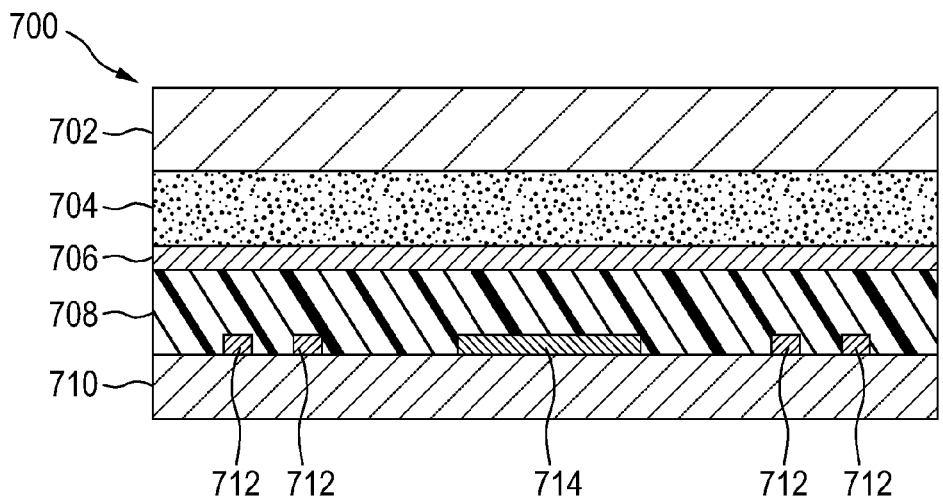
Figure 7:
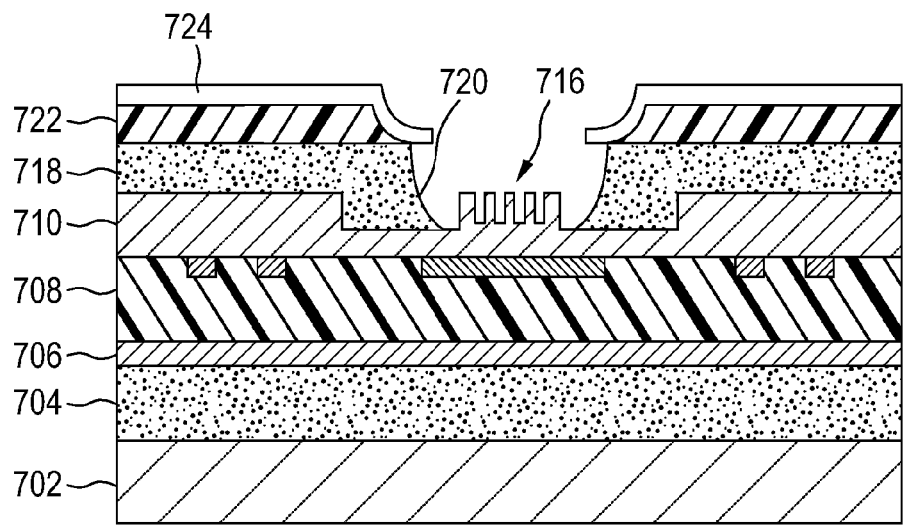
Figure 7:
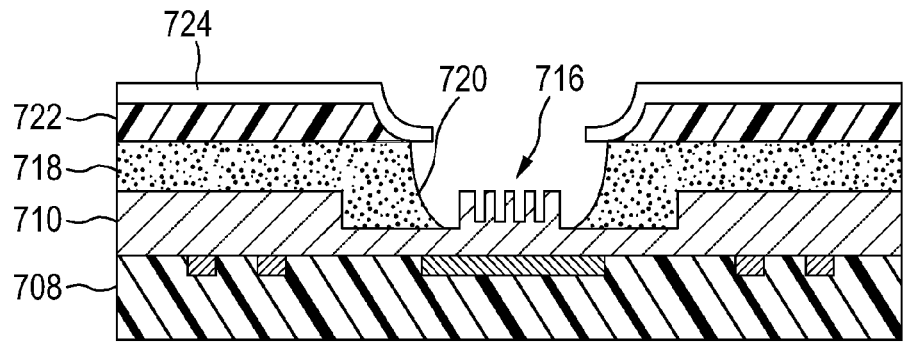

FIGS. 7A)-C) show different stages during the fabrication of an alternative Lab-on-chip device.

FIGS. 1A)-J) show different stages of a fabricating process for an integrated electronic-microfluidic device that contains a micro-calorimetric sensor.

The starting point of the description is a fully processed CMOS or BiCMOS wafer. A semiconductor wafer that has been processed in an alternative dedicated integrated-circuit fabrication process can, of course, be used as well. Note that the term wafer is used herein in short with the same meaning as the term semiconductor wafer. The term wafer is sometimes also used to refer to the semiconductor wafer that has been or is being processed according to the invention, that is, a semiconductor sandwiched between two support plates, as will be clear from the respective context.

FIG. 1A) shows a schematic cross section of the sensor integrated circuit (IC) 100. During previous CMOS or BiCMOS or other circuit processing, electronic circuits 102 and 104 have been formed on a silicon substrate 106. The circuits are not shown. However, they are arranged between field oxide regions 108, with a metal layer 110 on top, for forming or connecting to bond pads. On edges of the silicon substrate 106, bond pad extensions 112 and 114 are deposited, which will be used during later processing for forming internal T-shaped internal-contact elements.

A vertical arrow 116 points to the desired position of a microfluidic structure for use in a microcalorimetric sensor device. A temperature sensor is provided in the silicon substrate at the position shown by arrow 116. Surrounding field oxide regions are 118 and 120 are shown. The temperature sensor can for instance be formed by a pn-junction (not shown) Additional circuitry serving for signal amplification, an analog-digital conversion, interfacing, etc. can be provided.

It is understood that for industrial fabrication the silicon substrate 106 shown forms a part of a silicon wafer that contains a multitude of devices like that shown in FIG. 1A). In the present description, therefore, the terms substrate and wafer will be used without differentiation, unless explicitly stated.

In a next processing step, the silicon wafer 106 is glued top-down to a glass support plate 122. An adhesive layer 124 is used in this processing step, the result of which is shown in FIG. 1B).

In a subsequent processing step, the silicon wafer is thinned by grinding (cf. FIG. 1C)). A typical thickness is between 50 and 100 micrometers. In a next step, the silicon substrate is removed from portions that will in a later processing step (cf. FIG. 1F)) be used for forming notches in the wafer. The removal is performed by dry etching. The dry-etching stops at the field oxide layers abutting the extended bond pad regions 112 and 114.

In the same step, a microfluidic structure 126 is formed by dry etching. Therefore, the same mask can be used for the removal of the substrate on the lateral edges of the future chip and for forming the microfluidic structure 126. In the present case, the microfluidic structure contains a set of microfluidic channels. One example channel is shown under reference number 128. The multi-channel structure of microfluidic structure 126 serves to increase a reaction surface for chemical fluids.

A trench 130 is formed in the silicon substrate around microfluidic structure 126. The trench is also formed in the dry-etching step using the same mask, together with the channel structure 128. This processing therefore integrates the formation of a microfluidic structure into the known Shell-Case processing of WO 95/19645. The required modification in the mask layout does not require an alteration of the processing.

Next, the wafer is glued to a second glass support plate 132 (FIG. 1E)) using an adhesive layer 134. Subsequently, notches 136 and 138 are formed extending through the first glass support plate 122 and adhesive layer 124, and laterally abutting extended bond pads 112 and 114. The notches are formed by sawing. The bottom faces 140 and 142, respectively, of the notches lie in the second adhesive layer 134.

Subsequently, a redistribution metallization layer 144, 146 is formed on the outer face of the first glass support plate 122. This way, the extended bond pad regions 112 and 114 are connected with the redistribution metallization 144 and 146, respectively. A signal interface structure with T-shaped internal-contact elements 148 and 150 is created this way, wherein the bond pad extensions form substrate sections 112 and 114 of the contact element that correspond to the vertical T-bars, and side-face sections 152 and 154 of the redistribution metallization form isolated lead-sections on the inclined surfaces of the notches in glass support plate 122 and correspond to the horizontal T-bars. The isolation on the outer face of the notches is accomplished by depositing an isolation layer 155 over the redistribution metallization 144, 146. The redistribution metallization layer is connected to solder bumps 156 and 158.

In a next step, a hole 160 is fabricated in the second glass support plate 132 in the lateral area of the microfluidic structure 126, FIG. 1H). This can for instance be accomplished by sandblasting a selected region of glass support plate 132, stopping on the elastic adhesive layer 134.

The adhesive layer 134 is subsequently removed in the area of the hole 160 by oxygen plasma etching, FIG. 1I). This way, all adhesive material from adhesive layer 134 is removed from the microfluidic structure 126 and a surrounding region in the trench 130. The microfluidic structure 126 is thus effectively provided with a surrounding thermal isolation. If desired, the trench 130 can be filled with a thermally isolating material, without, however, filling the channels 128 of the microfluidic structure 126.

In a following step, the wafer is diced in the notches 136 and 138, to obtain individual electronic-microfluidic devices 162.

As can clearly be seen in FIG. 1 J), access for chemical fluids is provided through the hole 160 in the glass support plate 132 on one side of the device 162, while an electrical interface to external devices is provided by the solder bumps 156 and 158.

FIG. 2 shows a System-in-Package 200 that is formed by mounting the electronic-microfluidic device 162 on a printed circuit board (PCB) 202. The mounting is performed by a soldering step, followed by an application of a underfill 204 suitable for sealing the electrical contacts. If desired, it is possible to arrange via holes, examples of which are shown by reference numerals 206 and 208, underneath the electronic-microfluidic device 162, in such way, that there are no electrical conductors on the sensor side of the PCB 202.

This way, the System-in-Package 200 has a "wet side" 210 allowing wet-chemical access, which is clearly separated from an "electrical side" 212 for electrical signal exchange with external devices.

FIGS. 3A-I show different stages during the fabrication of a Lab-on-chip device.

Starting point of the present embodiment is again a fully processed silicon wafer 300. The wafer contains electronic circuits fabricated according to standard CMOS or BiCMOS processes. It may some times be necessary to make small additions or modification to the CMOS process, depending on the requirements of the Lab-on-chip to be fabricated. In other examples, it may be more cost-effective to use a simple low-cost process without any active devices instead of a CMOS or BiCMOS process.

The schematic cross sectional view of FIG. 3A) shows the wafer 300 with several partially prefabricated components. Note that the arrangement of different components, which will be described in the context of the present embodiment, is purely illustrative and mainly serves to explain the processing of different features. A real Lab-on-Chip device can have a totally different arrangement of individual microfluidic structures, corresponding to the needs and requirements of a particular application.

Going from left to right, a heater array 302 is formed on an interlevel dielectric layer 304 in the form of a metal or polysilicon meander resistor. The lateral position of the heater array corresponds to that of a thermally isolated reaction chamber that will be fabricated during later processing, cf. FIG. 3E).

On the right side of heater array 302, two contacts 308 to the silicon wafer are provided, which will be connected during later processing steps with two field plates for an electrophoretic pump. On the right side of the two contacts 308, a photodiode array 310 is provided for use in photoluminescence detection from adjacent microfluidic channels that will be formed during later processing, cf. FIG. 3E). On the right side of the photodiode array 310, two contacts 312 are provided for a direct galvanic contact to a liquid in a reaction chamber, that will be formed during a later processing step, cf. FIG. 3E). Also shown is a bond pad extension 314, which will be used for forming internal-contact elements, as has been described in the previous embodiment. Another example of a pump structure that can be provided is an electro-osmotic pump.

The subsequent processing, which is shown by FIGS. 3B) through 3D), corresponds to that described in the context of the previous embodiment with reference to FIG. 1C). The silicon wafer is glued to a first glass substrate 322 by means of an adhesive layer 324, FIG. 3B). Then the wafer is turned upside-down (FIG. 3C)) and the silicon substrate is thinned to a desired thickness from the backside, FIG. 3D). The thickness of the silicon substrate after this step is typically in the order of 50 to 100 Micrometer.

Subsequently the silicon wafer is patterned to form microfluidic structures. The formation of microfluidic structures is performed with the same mask step as the ShellCase patterning would be performed. However, in contrast to the embodiment of FIGS. 1 and 2, and deviating from the ShellCase processing, there is no lateral reduction of the silicon wafer 306 in this embodiment. To accommodate the resulting problem of short cuts between the T-shaped internal-contact element and the substrate, an electrical-isolation trench 383 is formed in the wafer near the bond-pad extension 314.

In this patterning step, a reaction chamber 364 is formed at the lateral position of the heater array 302. A thermal isolation trench 366 surrounds the reaction chamber 364. Furthermore, two field plates 368 and 370 are formed in the substrate 306 at the lateral positions of contact elements 308. The field plates are surrounded by a trench 372. Furthermore, microchannels 374 through 380 are formed abutting the photodiode array 310. Finally, a galvanic reaction chamber 382 is formed at the lateral position of the galvanic contacts 312.

The formation of microfluidic devices can for instance be achieved by the Bosch etching process, which is well known in the art. The field-oxide layer 304 on the front side of semiconductor wafer 306 is used as an etch-stop layer in this step.

With the next step, the created microfluidic structures in wafer 306 are sealed by mounting the substrate to a second glass support plate 332. The second glass support plate 332 contains holes (not shown), which serve as openings for incoming and outgoing fluids.

There are several ways how the second glass support plate 332 can be attached to the silicon wafer 306 without filling the formed microchannel cavities. A standard approach would be to use anodic bonding. This, however, would require very flat and clean surfaces. Additionally, the temperatures required for the bonding process may be too high for the adhesive used to glue the first glass support plate 322.

Therefore, Benzocyclobutene (BCB) is preferably used as an adhesive in the present embodiment. BCB is spun to a layer 334 with a thickness of 5 to 10 Micrometer. The BCB layer 334 is then soft-baked at 120° C., until it is completely dry.

During a subsequent heating step, BCB becomes fluid with a water-like viscosity, when a temperature of 170° C. is reached. Upon further heating to 200° C., the BCB layer 334 solidifies again and finally cross-links at 200° C. With this property, BCB is ideally suitable for planarizing and also for adhesive bonding over the formed cavities. This can be achieved by applying a pressure when placing the second glass support plate 332 with the BCB layer onto the wafer 306 and heating this resulting sandwich structure to 170° C. At this point BCB will become liquid, but will not enter into the formed cavities in the wafer 306, due to the limited volume of BCB that is available, and due to capillary forces. When the temperature is further increased to 200° C. the BCB cross-links, resulting in a permanent attachment of the second glass support plate 332 to the wafer 334.

The further process flow corresponds to that of FIGS. 1F), 1G) and 1I), and is shown in FIGS. 3G), 3H) and 3I). It is noted that in the present embodiment the formation of notches 338 differs from that of the processing of FIG. 1 in that the bottom face 340 of the notches lies in wafer material, and not in an adhesive layer. Therefore, a rerouting layer 354, which is subsequently deposited on the inclined surface of the stacked substrate, is in direct contact with the wafer 306, forming an interface 390. The electrical isolation trench 383 avoids electrical shorts between the wafer 306 and the T-shaped internal-contact element 350. This processing also differs from that of the known ShellCase process.

FIG. 4 shows a Lab-on-chip device integrated in an assembly on a printed circuit board. Similarly to the assembly shown in FIG. 2, the completed electronic-microfluidic Lab-on-chip device 362 is placed on a printed circuit board 402, and electrical contacts between the electronic-microfluidic device 362 and the PCB 402 are sealed by an underfill 404. Again, a clear separation between an electrical side and a wet-chemical side of the assembly is achieved.

FIGS. 5A)-D) show different stages during the fabrication of a variant of the Lab-on-chip device of FIGS. 3 and 4. The processing of the present embodiment largely corresponds to the processing shown in FIG. 3. However, the Lab-on-Chip device 500 of the present embodiment is provided with an interface for a disposable lid that allows to change the wet interface and to easily clean the Lab-on-Chip structure.

For simplicity of explanation, the silicon wafer 506 is shown with one microfluidic reaction chamber 564 only. The reaction chamber 564 and a surrounding thermal-isolation trench 566 are shown. However, it is understood that this only serves as an example for the applicability of the disposable-lid concept. Other microfluidic structures can equally benefit from this concept.

Also shown are electrical isolation trenches 583 and 585 near bond pad extensions 512 and 514 that, like heater array 502 are formed over a field-oxide layer 504. In the processing stage shown in FIG. 5A) the semiconductor wafer 506 has been mounted on the first glass support plate 522, thinned, and subjected to a patterning from the backside by the Bosch process in order to form the microfluidic structures 564, 566. This processing stage corresponds to that shown in FIG. 3F), and steps corresponding to those described with reference to FIGS. 3A) to 3E) can be followed to reach this state.

A difference from the processing shown in the earlier embodiments is that the second glass support plate 532 is provided with an opening 594 that has inclined side faces 596 and 598. The opening 594 is later used for holding a disposable lid. It is noted that the opening 594 is formed after applying a BCB adhesive layer 534 to the second glass support plate 532.

In a next step, shown in FIG. 5B), the second glass support plate 532 is glued to the silicon wafer 506, using BCB as an adhesive.

The remainder of the processing, shown in FIGS. 5C) and 5D) is identical to that of the previous example, FIG. 2H), and FIG. 2I).

FIG. 6 shows the Lab-on-chip device fabricated according to the method of FIG. 5.

The Lab-on-chip device 600 of FIG. 6 resembles the structure shown in FIG. 4. It only differs in the provision of a disposable lid 620, which also contains a wet-chemical in- and output, as illustratively shown by an opening 622. Note that the lid need not necessarily have such wet-chemical input and output openings. They can instead be provided on the second glass support plate 532. The disposable lid 620 is preferably made by a molding- or casting technique and is in one embodiment coated by a flexible layer to insure adequate sealing of the microchannel structure of the Lab-on-chip device 562. It is also possible to apply a mechanical clip or a fastening to keep the lid in its place in the opening 594. Further note that in alternative useful embodiments the side faces 596 and 598 of the opening 594 are vertical (not inclined). They can alternatively be inclined with a negative slope, wherein the opening 594 thus decreases in size from towards the outer face of the second glass support plate. The latter embodiment allows to achieve another simple way of fastening the lid 620 by "clicking" the lid into the opening 594.

FIGS. 7A) to 7C) show different stages during the fabrication of an alternative example of an integrated electronic-microfluidic device.

In general, the fabrication of the electronic-microfluidic device 700 resembles that of the earlier embodiments, in particular in that a substrate transfer technology is used. Also, the fabrication and structuring of the semiconductor substrate 710 follows the procedure outlined above.

In contrast to the previous embodiments, the signal interface structure is formed by an antenna 712, which is fabricated on the semiconductor substrate prior to the deposition of further layers. The antenna 712 has a coil structure and is used for receipt and transmission of signals between the electronic circuit and an external device. It is also possible to use the antenna for receiving energy that can be used for operation, for instance during signal transmission. Subsequently a layer stack is fabricated that comprises a polyimide layer 708 on top of semiconductor substrate 710, an oxide layer 706 and adhesive layer 704, and a glass plate 702.

The sequence of the glass plate 702, adhesive 704 and oxide layer 706 is used for a temporary support during the fabrication process, as will be come clear from the description of FIGS. 7B) and 7C).

In subsequent steps, the semiconductor substrate 710 is structured on its backside to produce a mircofluidic structure 716, followed by deposition of an adhesive 718 and a second support 722. In the present example, the second support 722 is made from a polyimide. However, glass may also be used, according to the specific needs during operation of the device. Note that, depending on the particular material choice, the adhesive layer 718 may actually form a part of the polyimide layer 722. Optionally, as shown in the present example, a coating layer 724 may be deposited on top of the second support 722. The coating may for instance be water-repellent.

FIG. 7C) shows the finished device 700 after removal of the glass plate 702, the adhesive 704, and the oxide layer 706. For removal, a lift-off process can be used. The oxide layer 706 is dissolved so that the glass plate and the adhesive layer 704 can be removed without further treatment.

The above description of preferred embodiments illustrates the applicability of the method of the invention for forming electronic-microfluidic devices with clearly separated interfaces for chemicals and for electrical signals. It was also shown in the embodiments that the method of the invention provides for an integration of the formation of microfluidic structures in the semiconductor substrate without adding complexity to the processing. It is merely by way of modifying masks that a wealth of microfluidic devices can be formed, only some of which were mentioned in the above description by way of example.

Note that the electronic-microfluidic device of the invention can also be traded in the form of an intermediate product, that is, as a wafer before dicing.

In one embodiment the semiconductor substrate of the electronic-microfluidic device of the invention is a Silicon-on-Insulator (SOI) substrate. An electronic-microfluidic device of this embodiment preferably contains a semiconductor device, such as a photodiode, in the semiconductor region of the SOI substrate, directly abutting micro-channels or reaction chambers, which are formed in the insulating region of the SOI substrate.

The electronic-microfluidic device can be used for liquids or for gases, or for both liquids and gases, using different interfaces. In this case, a separate gas interface is provided on the same side as the wet-chemical interface, similar to the chemical interfaces described in the previous embodiments.

Instead of glass or a polymer, other known materials can be used for the support plate, such as a ceramic material.

In the following claims, reference numbers shall not be construed as a limitation of the scope of the claims.

The invention claimed is:

1. An integrated electronic-microfluidic device, comprising
   a semiconductor substrate on a first support;
   an electronic circuit on a first semiconductor-substrate side of the semiconductor substrate;
   a signal interface structure to an external device, the signal interface structure being arranged on the first semiconductor-substrate side and configured to receive electrical signals from the electronic circuit; and
   a microfluidic structure formed in the semiconductor substrate, the microfluidic structure being configured to confine a fluid to a second semiconductor-substrate side that is opposite to the first semiconductor-substrate side and faces away from the first support and to allow a flow of the fluid to and from the microfluidic structure only on the second semiconductor-substrate side.

2. The integrated electronic-microfluidic device of claim 1, further comprising a second support on the second semiconductor-substrate side, the second support having an opening that allows a flow of the fluid to and from the microfluidic structure.

3. The integrated electronic-microfluidic device of claim 2, wherein the signal interface structure comprises at least one T-shaped internal-contact element, with a substrate section corresponding to the vertical T-bar that is arranged on the semiconductor substrate and is connected to the electronic circuit, and with a side-face section corresponding to the horizontal T-bar that is arranged on an inclined side face of the substrate and forms an electrically isolated lead connecting to external-contact elements on an outer face of the first support, the external-contact elements being configured to establish an electrical contact to an external device.

4. The integrated electronic-microfluidic device of claim 3, wherein the side-face section of the T-shaped internal-contact element is arranged abutting the semiconductor substrate, and wherein a the semiconductor substrate comprises a first electrical-isolation trench that is arranged and configured to isolate the side-face section Of the T-shaped internal-contact element on one side of the first electrical-isolation trench from semiconductor substrate portions on the opposite side of the first electrical-isolation trench.

5. The integrated electronic-microfluidic device of claim 1, wherein either only the first support or the first and second supports are thermally insulating, and wherein the microfluidic structure is surrounded by a first thermal-isolation trench in the semiconductor substrate that is open to the second semiconductor substrate side and is filled with a thermally insulating material or is at least partially empty.

6. The integrated electronic-microfluidic device of claim 5, wherein the first thermal-isolation trench extends from the second semiconductor-substrate side through the semiconductor substrate and is covered on the first semiconductor-substrate side by a thermally insulating layer, which is arranged on the semiconductor substrate.

7. The integrated electronic-microfluidic device of claim 1, wherein the microfluidic structure comprises a reaction chamber formed by a first recess in the semiconductor substrate and confined by a recess wall, and a second thermal-isolation trench surrounding the recess wall.

8. The integrated electronic-microfluidic device of claim 1, wherein the microfluidic structure comprises an electrophoretic pump with a second recess in the semiconductor substrate and two field plates, which are formed by recess walls, which are electrically isolated from the semiconductor substrate by an adjacent second electrical-isolation trench.

9. The integrated electronic-microfluidic device of claim 1, wherein the electronic circuit comprises a photodiode that is arranged immediately adjacent to a microfluidic structure in the form of a microfluidic channel in the semiconductor substrate.

10. The integrated electronic-microfluidic device of claim 1, wherein the electronic circuit comprises two contact elements on the first semiconductor substrate side that extend to a microfluidic structure in the form of a third recess in the semiconductor substrate and are configured to establish a direct galvanic contact to a fluid in the third recess.

11. The integrated electronic-microfluidic device of claim 2, wherein an adhesive layer of Benzocyclobutene, BCB, is arranged between the second support and the semiconductor substrate.

12. The integrated electronic-microfluidic device of claim 1, wherein the opening in the second support is configured to hold a removable lid.

13. The integrated electronic-microfluidic device of claim 12, comprising a removable lid arranged in the opening.

14. The integrated electronic-microfluidic device of claim 2, wherein the first and second supports are glass plates.

15. The integrated electronic-microfluidic device of claim 2, wherein the first or second support is made from a polymer.

16. The integrated electronic-microfluidic device of claim 1, wherein the signal-interface structure comprises an antenna that is configured to transmit and receive electromagnetic signals in the radio frequency spectrum.

* * * * *